(12) United States Patent
Song

(10) Patent No.: US 6,632,996 B2
(45) Date of Patent: Oct. 14, 2003

(54) MICRO-BALL GRID ARRAY PACKAGE TAPE INCLUDING TAP FOR TESTING

(75) Inventor: Yoon-Gyu Song, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 16 days.

(21) Appl. No.: 09/940,877

(22) Filed: Aug. 29, 2001

(65) Prior Publication Data

US 2002/0043390 A1 Apr. 18, 2002

(30) Foreign Application Priority Data

Oct. 16, 2000 (KR) ........................................ 2000-60706

(51) Int. Cl.[7] ................................................ H05K 5/00
(52) U.S. Cl. ...................... 174/52.1; 361/767; 257/734; 257/780; 174/52.4
(58) Field of Search .............................. 174/52.1, 52.4; 361/736, 743, 748, 767; 257/734, 737, 738, 777, 780

(56) References Cited

U.S. PATENT DOCUMENTS 5,892,277 A * 4/1999 Ikemizu et al. ............. 257/700
6,320,136 B1 * 11/2001 Sakamoto ................... 174/255
6,320,267 B1 * 11/2001 Yukawa ...................... 174/260
6,329,606 B1 * 12/2001 Freyman et al. ............ 174/260

FOREIGN PATENT DOCUMENTS

JP          8070024          3/1996

* cited by examiner

Primary Examiner—Dean A. Reichard
Assistant Examiner—W. David Walkenhorst
(74) Attorney, Agent, or Firm—Volentine Francos, PLLC

(57) ABSTRACT

A package tape for testing a chip assembled by a packaging method such as a micro-ball grid array (BGA) package, whereby the chip is designed to face downward. The package tape includes one or more taps, disposed on a guard area other than an area where a semiconductor chip is attached, for testing the semiconductor chip. One or more pads are disposed on the area where the semiconductor chip is attached and are attached to corresponding test pads on the semiconductor chip. One or more leads which electrically connect the taps with the pads. The package tape advantageously enables easy testing of the electric characteristics of the semiconductor chip, which in a typical BGA package tape cannot be tested by probing since the circuit thereof faces down.

20 Claims, 4 Drawing Sheets

MICRO-BALL GRID ARRAY PACKAGE TAPE INCLUDING TAP FOR TESTING

The present application claims priority under 35 U.S.C. §119 to Korean Application No. 2000-60706, which is hereby incorporated by reference in its entirety for all purposes.

BACKGROUND OF THE INVENTION

1. Field of the Invention

The present invention relates to a semiconductor device having a package type in which an integrated circuit of a semiconductor chip faces down, and more particularly, to a micro-ball grid array (BGA) package tape which is adapted to test a chip using a micro-BGA package tape.

2. Description of the Related Art

In many wireless devices such as competitively developing cellular phones, camcorders, and memory cards, demands for large system storage capacity and high-speed operation are on the increase. For example, as the speed of CPUs of PCs increases, large storage capacities and high speed operations of memory devices are required.

To overcome this problem, new memory technologies are being developed, an example of which is a recently developed Rambus DRAM (RDRAM). While maximizing the performance of memory devices, various semiconductor packaging technologies that offer high quality and high reliability are developed so as to prevent the performance of high-speed, large-capacity devices from decreasing. A representative example thereof is a chip scale package (CSP), and most semiconductor manufacturers tend to announce CSP products as their own brand name.

CSPs have two chief advantages: one is to keep the size and weight of the package to a minimum, and the other is to allow a high speed operation by low inductance. Among those CSPs, a micro-BGA developed by Tessera, Inc., is a real chip size package. The micro-BGA packages can reduce the size and weight of the package to about a third compared to conventional packages. Furthermore, they are advantageous in significantly relieving stresses by their unique structures. Currently, high-speed RDRAMs employ the micro-BGA package.

FIG. 1 shows a conventional packaging method. The conventional packaging method involves encapsulating a chip 100, on which a circuit 110 is embedded, in molding compounds 120 and connecting the encapsulated chip 100 to sockets 140 using pins 130.

FIG. 2 shows a micro-BGA packaging method. Referring to FIG. 2, a chip 200, on which a circuit 210 is embedded, is attached to one surface of a tape 220 by an adhesive (not shown), and conductive metal patterns (not shown) for beam lead bonding formed in the tape 220 itself are beam lead bonded to bonding pads (not shown) of the chip 200. Solder balls 230 are attached to the other surface of the tape 200 and connected to corresponding sockets 240. Here, the tape 220 is an insulating film of a polyimide material.

As shown in FIG. 2, there is a difference between the conventional packaging method and the micro-BGA packaging method. That is, an adhesive such as elastomer or a polyimide-based organic substrate is used instead of a leadframe which forms the framework of the conventional package, and solder balls and solder bumps are used as an external connection terminal instead of pins. Thus, the micro-BGA package can provide for further increased mounting density during a process of mounting a chip and other components on a printed circuit board (PCB).

However, in most semiconductor chips, monitoring pads such as a DC check pad and test mode pads, other than control pads, data pads and power pads, are not wire bonded. Thus, in order to check whether semiconductor chips assembled by the conventional packaging method are defective or not, a semiconductor package in operation is de-capped and then probing is directly performed on a pad to be tested, to measure the electric characteristics such as a DC level. In the conventional packaging method, since the circuit 110 of the semiconductor chip 100 is assembled so as to face upward, actual probing is allowed after de-capping the package.

However, since the micro-BGA package is assembled such that the circuit 210 of the semiconductor chip 200 faces down, it is impossible to perform probing even after decapping the package.

SUMMARY OF THE INVENTION

The present invention is therefore directed to a micro-ball grid array package tape including a tap for testing, which substantially overcomes one or more of the problems due to the limitations and disadvantages of the related art.

To solve the above problems, it is an object of the present invention to provide a package tape for easily checking the electric characteristics of a semiconductor chip.

Accordingly, to achieve the above and other objects, the present invention provides a package tape for testing a chip assembled by a micro-ball grid array (BGA) packaging method. The package tape includes one or more taps, disposed on a guard area other than an area where a semiconductor chip is attached, for testing the semiconductor chip; one or more pads, disposed on the area where the semiconductor chip is attached, and attached to corresponding test pads on the semiconductor chip; and one or more leads which electrically connect the taps with the pads.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
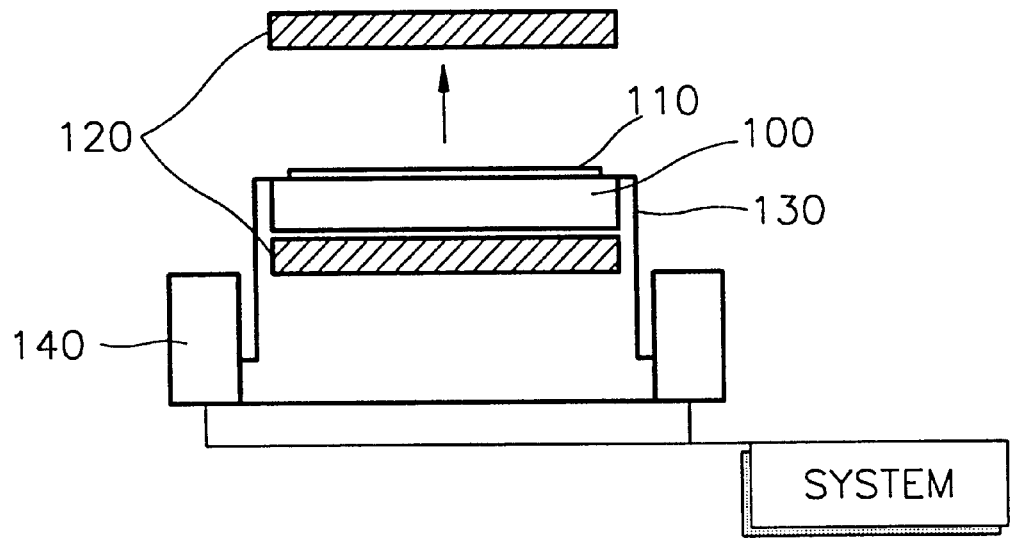
FIG. 1 shows a conventional packaging method.
Figure 2:
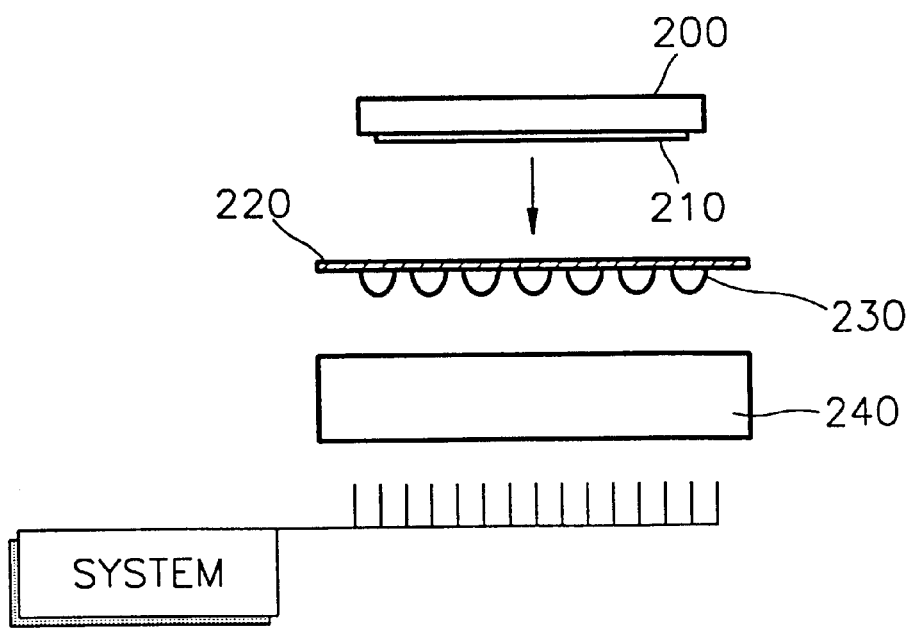
FIG. 2 shows a micro-ball grid array (BGA) packaging method.

The present invention will now be described more fully with reference to the accompanying drawings, in which preferred embodiments of the invention are shown. The same reference numerals appearing in different drawings represent the same element.

Figure 3:
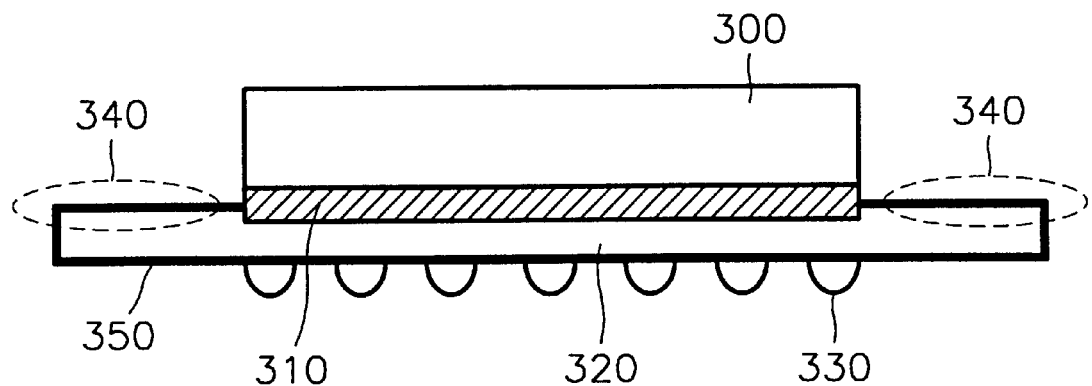
FIG. 3 is a side view of the structure of a micro-BGA package.

Referring to FIG. 3, a circuit 310 designed on a semiconductor chip 300 faces down, and is attached to one surface of a tape 320. Solder balls 330 are attached to the other surface of the tape 320. Taps (not shown) and leads (not shown) are provided on guard areas 340, which are portions of the tape 320 in the vicinity of the chip 300, as will be described below with reference to FIG. 4. The remaining portion of the tape 320, excluding the portion to which the chip 300 is attached, is covered with a protective layer 350. The protective layer 350 is formed of a black opaque silicon rubber so as to protect and insulate wires of the tape 320.

Figure 4:
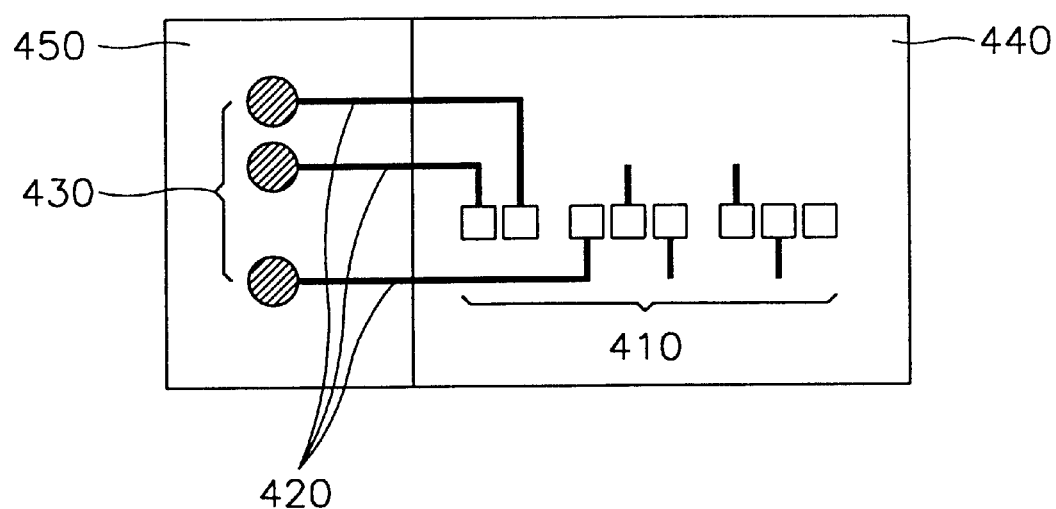
FIG. 4 shows a package tape according to an embodiment of the present invention.

Referring to FIG. 4, in a package tape according to an embodiment of the present invention, pads 410 attached to corresponding test pads (not shown) on a semiconductor chip are disposed on an area 440 where the semiconductor chip is attached, and one or more taps 430 are disposed on a guard area 450. Leads 420 electrically connect the taps 430 with the pads 410.

The tape package according to an embodiment of the present invention will now be described in detail with reference to FIG. 4. Since a micro-ball grid array (BGA) package is assembled so that a circuit of a semiconductor chip faces down, it is impossible to perform probing even after de-capping. Referring to FIG. 4, the pads of the semiconductor chip are connected with the corresponding pads 410 on the tape. The leads 420 extend from the pads 410 on the tape to the guard area 450, and the taps 430 are disposed at the end terminal thereof so as to make it easy to perform probing. The taps 430 are also formed of a conductive metal such as copper, like the leads 420. Thus, it is impossible to perform probing directly on the pads 410, for which monitoring or forcing is desired, but probing may be carried out on the taps 430 connected thereto and disposed on the guard area 450 so as to test the chip.

Figure 5A:
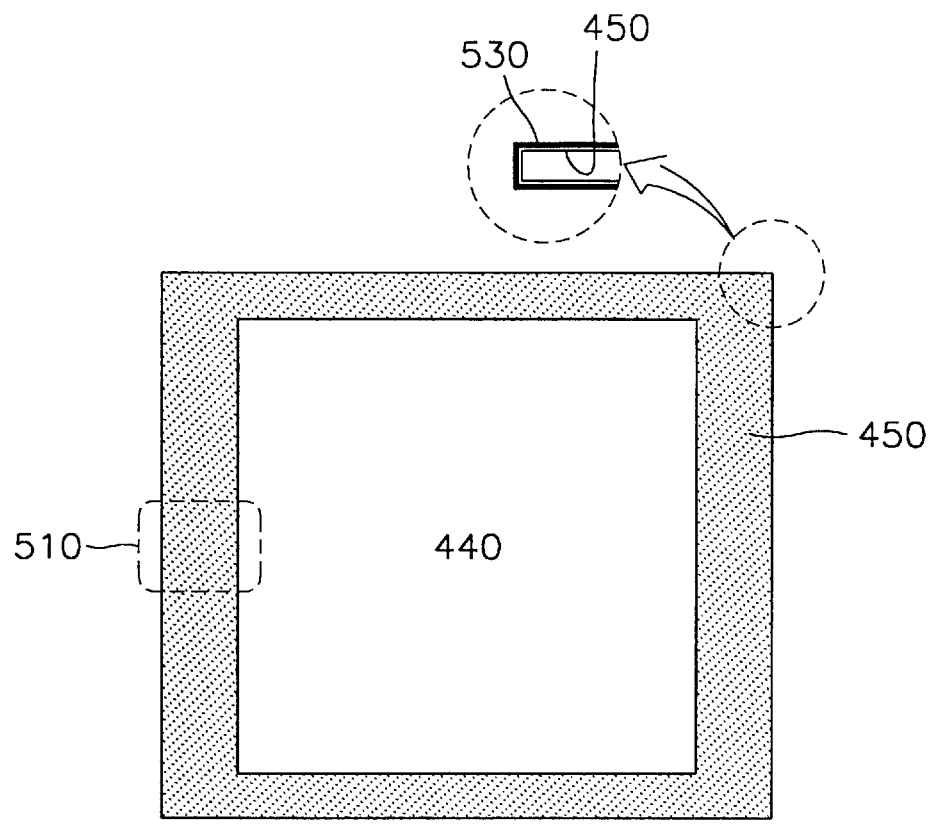
FIG. 5A is a top view of a micro-BGA package using the package tape of FIG. 4.
Figure 5B:
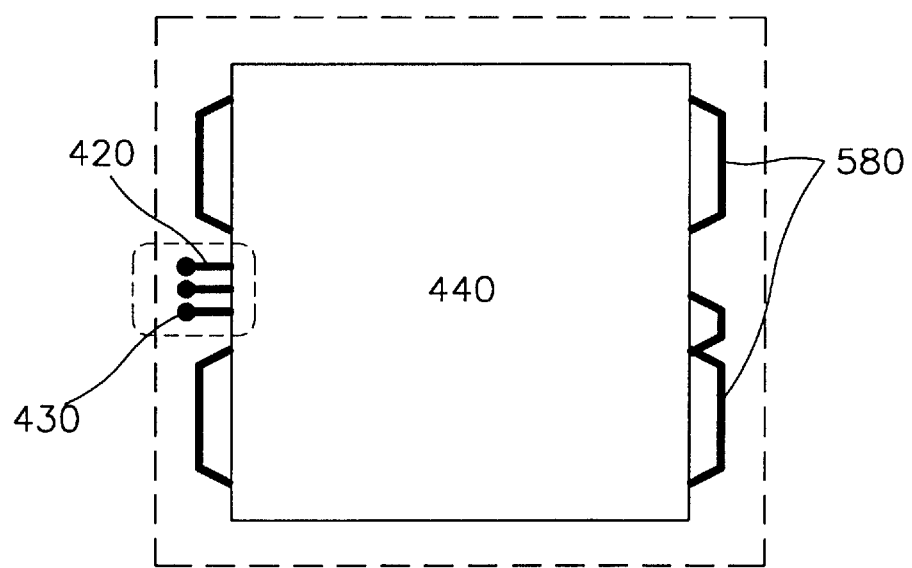
FIG. 5B is a top view of the micro-BGA package of FIG. 5A after decapping the package.

Referring to FIG. 5A, the guard area 450 at the periphery of the area 440 where the chip is attached is encompassed by a protective layer 530. That is, an area 510 where the taps 430 and the leads 420 are attached is not shown, and thus consumers tend to think of it as the same as conventional micro-BGA packages. Referring to FIG. 5B, when testing the characteristics of the chip, the protective layer 530 at the periphery of the area 440 where the chip is attached is removed by de-capping as indicated by the dotted lines, so that the leads 420 and the taps 430 are shown. Thus, like in other types of packages, monitoring or forcing can be performed using the taps 430 after decapping, so as to test the characteristics of the chip. Wires 580 connecting internal pads are routed to the outside of the area 440 where the chip is attached.

Figure 6:
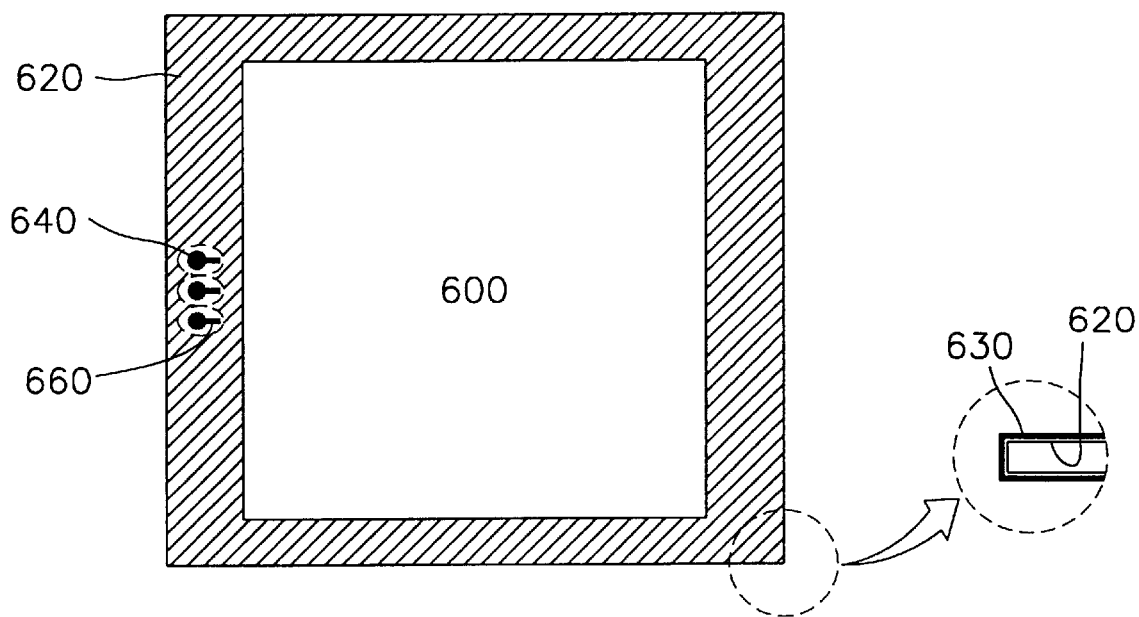
FIG. 6 is a top view of a micro-BGA package using a package tape according to another embodiment of the present invention.

FIG. 6 is a top view of a micro-BGA package using a package tape according to another embodiment of the present invention. A guard area 620 at the periphery of an area 600 where a chip is attached is encompassed by a protective layer 630, and only a portion where taps 640 and leads 660 are disposed is exposed, as indicated by the dotted lines. Thus, in this case, a chip can be tested by means of monitoring or forcing without de-capping.

According to a typical micro-BGA package, since a circuit of a semiconductor memory chip faces down, it is impossible to perform probing on the chip. However, the micro-BGA tape according to the present invention advantageously enables easy testing of the electric characteristics of the semiconductor chip, without de-capping the entire chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A micro-ball grid array (BGA) package tape comprising:
   an insulating film, having a top surface, said top surface including,
      a first area, adapted for a semiconductor chip to be attached thereto, and
      a guard area at the periphery of the first area;
   one or more taps, disposed on the guard area on the top surface of the insulating film, for testing the semiconductor chip;
   one or more pads, disposed on the first area on the top surface of the insulating film, said pads being attached to corresponding test pads on the semiconductor chip; and
   one or more leads which electrically connect the taps with the pads.

2. The micro-BGA package tape of claim 1, wherein the taps are a conductive metal.

3. The micro-BGA package tape of claim 2, wherein the conductive metal is copper.

4. The micro-BGA package tape of claim 3, wherein the leads comprise copper.

5. The micro-BGA package tape of claim 1, wherein the taps are covered by a protective layer that is formed on the guard area.

6. The micro-BGA package tape of claim 5, wherein the protective layer comprises a black opaque silicon rubber.

7. The micro-BGA package tape of claim 1, wherein only a portion of the guard area where the taps are disposed is exposed, and a remaining portion of the guard area is covered by a protective layer.

8. The micro-BGA package tape of claim 7, wherein the protective layer comprises a black opaque silicon rubber.

9. The micro-BGA package tape of claim 1, wherein the first area on the top surface of the insulating tape is adapted to be attached to a circuit formed on the semiconductor chip.

10. A semiconductor device package tape comprising:
    an insulating film, having a top surface, said top surface including,
       a first area, adapted for a semiconductor chip to be attached thereto, and
       a second area at the periphery of the first area;
    at least one pad disposed at the first area on the top surface of the insulating film;
    a semiconductor chip adhered to the insulating film at the first area, the at least one pad being electrically connected to at least one corresponding test pad of the semiconductor chip;
    at least one tap disposed at the second area on the top surface of the insulating film; and
    at least one lead formed on the insulating film to electrically connect the at least one pad and the at least one tap.

11. The semiconductor device package tape of claim 10, wherein the second area is covered by a protective layer.

12. The semiconductor device package tape of claim 11, wherein the second area is entirely covered by the protective layer.

13. The semiconductor device package tape of claim 11, wherein only portions of the second area corresponding to the at least one tap are exposed through the protective layer.

14. The semiconductor device package tape of claim 11, wherein the protective layer comprises a black opaque silicon rubber.

15. The semiconductor device package tape of claim 10, wherein the at least one tap and the at least one lead are a conductive metal.

16. The semiconductor device package tape of claim 15, wherein the conductive metal is copper.

17. The semiconductor device package tape of claim 10, wherein the package tape is a micro-ball grid array (BGA) package tape.

18. The semiconductor device package tape of claim 10, wherein solder balls are attached to a second surface of the insulating film, the second surface being opposite the top surface of the insulating film.

19. The semiconductor device package tape of claim 10, wherein the semiconductor chip has a surface with a circuit formed thereon, the surface of the semiconductor chip being attached to the top surface of the insulating film at the first area.

20. The semiconductor device package tape of claim 10, wherein the second area is a guard area.

* * * * *